United States Patent
Borke

(10) Patent No.: US 6,188,567 B1
(45) Date of Patent: Feb. 13, 2001

(54) POWER DISTRIBUTION APPARATUS AND METHOD

(75) Inventor: John B. Borke, Wheeling, IL (US)

(73) Assignee: 3COM Corporation, Rolling Meadows, IL (US)

( * ) Notice: Under 35 U.S.C. 154(b), the term of this patent shall be extended for 0 days.

(21) Appl. No.: 09/322,595

(22) Filed: May 28, 1999

(51) Int. Cl.[7] ..................................... H05K 7/20
(52) U.S. Cl. .................. 361/622; 439/342; 439/929; 361/678
(58) Field of Search ..................... 439/626, 660, 439/929, 337, 342; 307/18, 147, 150; 454/184; 174/38, 39, 48, 52.1; 361/600–602, 622, 625, 641, 676–678, 683, 686, 694, 695, 687, 825, 829, 831

(56) References Cited

U.S. PATENT DOCUMENTS

| | | | |
|---|---|---|---|
| 3,564,482 | * | 2/1971 | Yamanaka . |
| 4,625,259 | * | 11/1986 | Krechmer . |
| 4,901,029 | * | 2/1990 | Fujino . |
| 4,931,904 | * | 6/1990 | Yiu . |
| 5,243,493 | * | 9/1993 | Jeng . |
| 5,523,917 | * | 6/1996 | Searby . |
| 5,562,410 | * | 10/1996 | Sachs . |
| 5,625,535 | * | 4/1997 | Hulsebosch . |
| 5,663,868 | * | 9/1997 | Stalley . |
| 5,703,751 | * | 12/1997 | Huang . |

\* cited by examiner

*Primary Examiner*—Gerald Tolin
(74) *Attorney, Agent, or Firm*—Baniak Pine & Gannon

(57) ABSTRACT

A power distribution apparatus includes an electronic chassis, a power distribution member and a first power supply. The electronic chassis includes a front wall, a back wall and first and second side walls. The power distribution member is positioned within the electronic chassis between the first and second side walls. The first power supply is mounted to an outer surface of the first side wall. Power is distributed from the first power supply to the power distribution member.

18 Claims, 2 Drawing Sheets

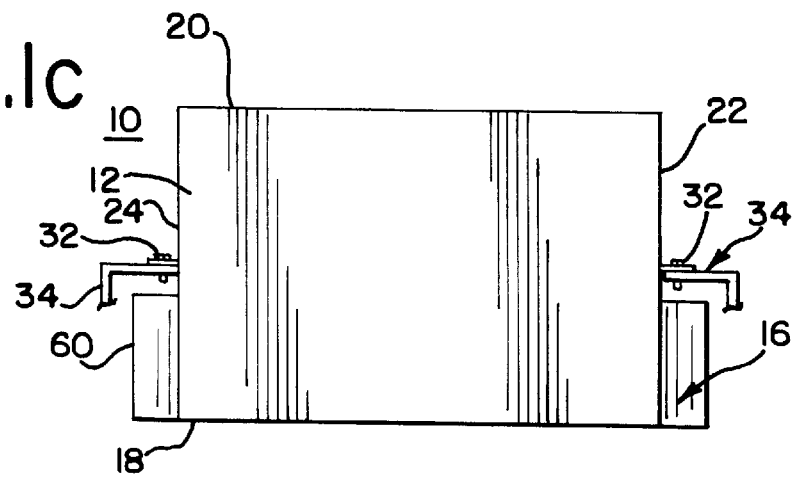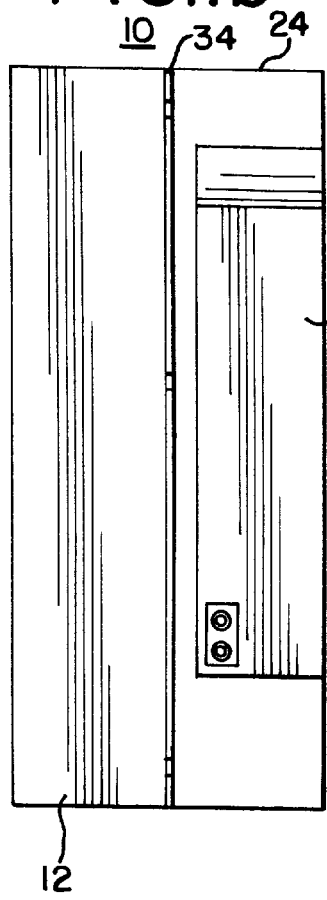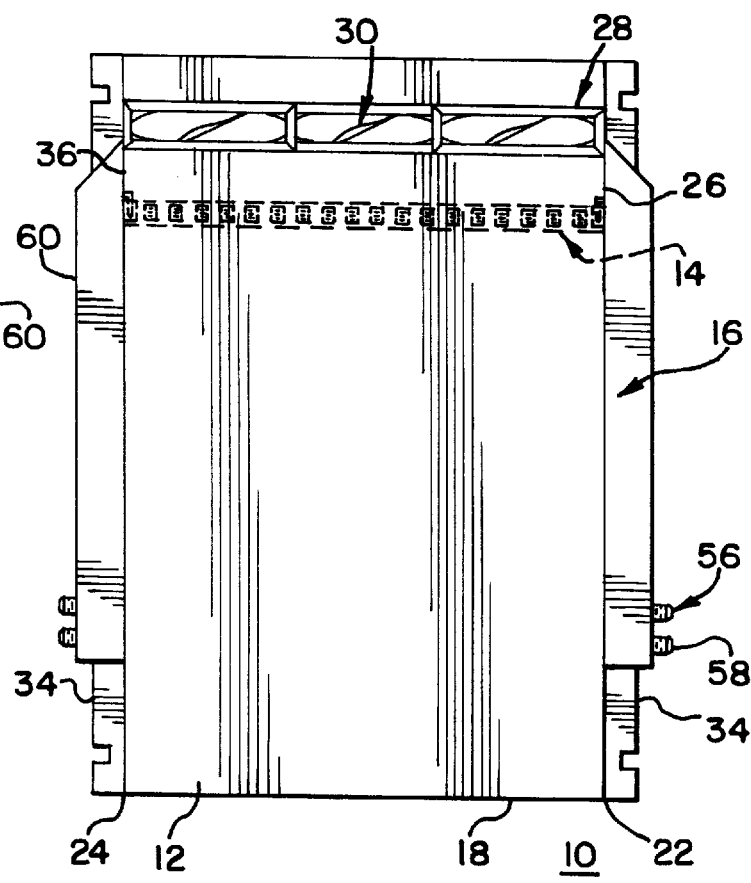

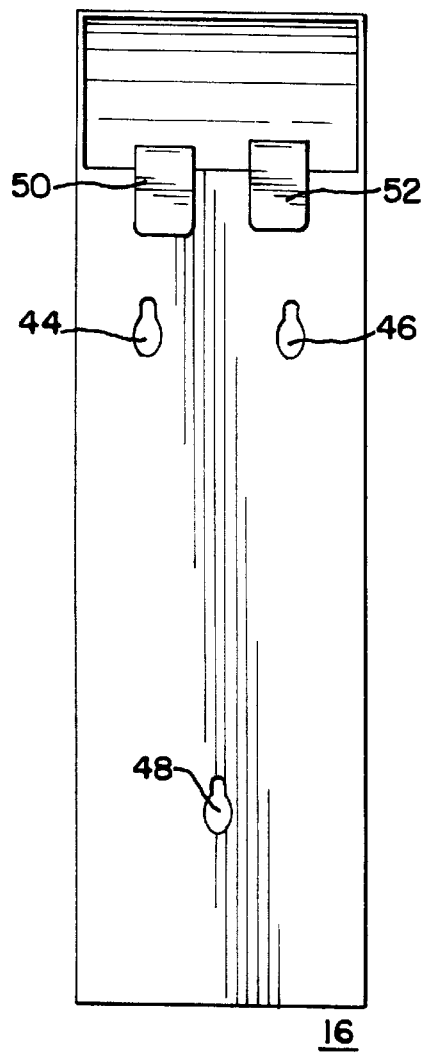
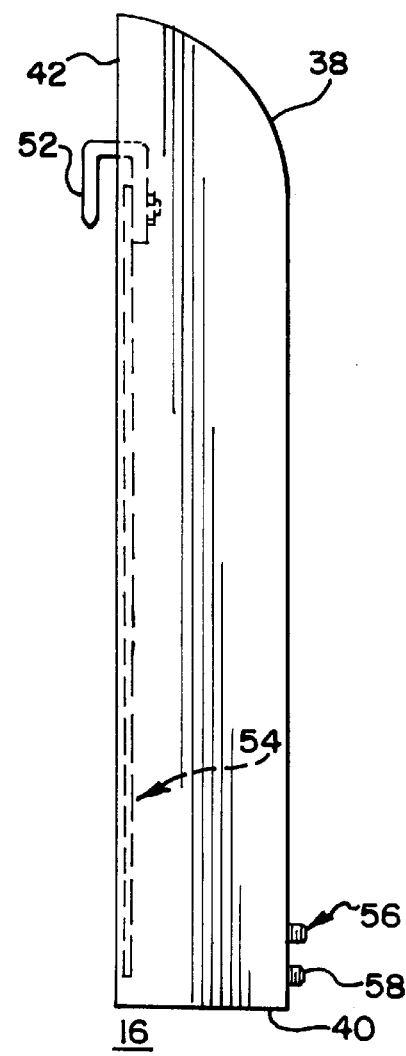
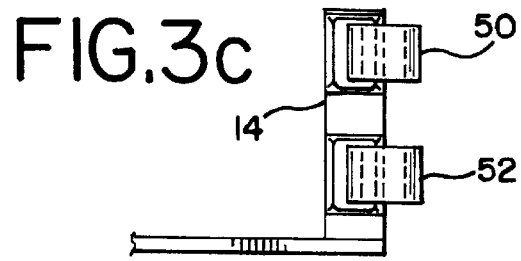
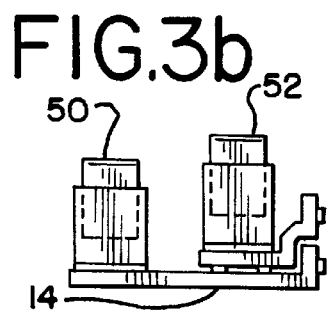
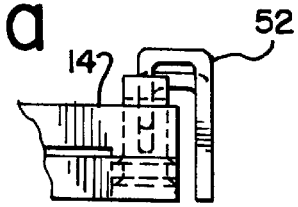

US 6,188,567 B1

POWER DISTRIBUTION APPARATUS AND METHOD

FIELD OF THE INVENTION

The present invention relates to power distribution devices, and, in particular, power distribution devices for use within telecommunications systems, which utilize electronic chassis.

BACKGROUND OF THE INVENTION

Within the telecommunications arena, the electronic chassis of power distribution devices are usually mounted on a rack within the central telecommunications offices. These rack-mounted devices, which are intended for use within telecommunication control offices, must conform to a series of Bellcore standards, in an effort to maintain uniformity in application. One such uniform standard concerns 19.000 inch wide equipment racks. These racks are typically found in Level Four switch rooms, and are most prevalent in Northeastern United States cities, such as New York and Boston. The 19.000 inch requirement, however, does maintain a distinct drawback: The available space for data transmission circuitry (also known as the density of the electronic chassis) is drastically reduced. As a result, the efficiency of the electronic chassis is similarly reduced. However, space is available outside the periphery of the electronic chassis. Thus, if a design could be utilized to take advantage of such presently wasted space, efficiency, as well as density, can be increased tremendously. In other words, a design that could get the power and performance of the 23.000 inch rack-mounted device from a 19.000 inch rack-mounted device. Accordingly, it would be desirable to have a power distribution device attached to an electronic chassis that would resolve the above problems and still be simple and efficient to operate.

SUMMARY OF THE INVENTION

One aspect of the invention provides a power distribution apparatus including an electronic chassis, a power distribution member and a first power supply. The electronic chassis includes a front wall, a back wall and first and second side walls. The electronic chassis may further include a first opening disposed along a top portion of the first side wall and a fan tray positioned along a top member of the electronic chassis. The electronic chassis, may, for example, have a width of 19.000 inches, and is operably mounted to a 19.000 inch standard rack mount. The power distribution member is positioned within the electronic chassis between the first and second side walls. The first power supply is mounted to an outer surface of the first side wall. The first power supply may include an outer shell. The outer shell may include a bottom opening and a top opening. The first power supply may include first, second and third openings, first and second hook ends, first and second input terminals and a main power supply PC board. A second power supply may be mounted to an outer surface of the second side wall.

A further aspect of the invention provides a method of operation of a power distribution apparatus. The method includes the steps of providing an electronic chassis, a power distribution member and a first power supply. The electronic chassis includes a front wall, a back wall and first and second side walls. A first opening and a fan tray may be disposed along a top portion of the electronic chassis. The power distribution member is positioned within the electronic chassis between the first and second side walls. The first power supply is mounted to an outer surface of the first side wall. An outer shell may be disposed within the first power supply. First, second and third openings may be disposed on the first power supply. The first power supply may also include first and second hook ends, and a main power supply PC board disposed therein. A second power supply may be mounted to an outer surface of the second side wall. Power is distributed from the first power supply to the power distribution member. Power may also be distributed from the second power supply to the power distribution member. Air may be drawn up through the first power supply from the bottom opening to the top opening. Air may also be drawn into the electronic chassis through the first opening. Air may be forced out of the electronic chassis and the first power supply and through the fan tray. The first power supply may be operably electronically connected to the power distribution member. The main power supply PC board may be operably electronically connected to the first and second hook ends.

A further aspect of the invention provides a power distribution apparatus including an electronic chassis, a power distribution member and first and second power supplies. The electronic chassis is operably mounted to a 19.000 inch standard rack mount, has a width of 19.000 inches and includes a front wall, a back wall and first and second side walls. A first opening, a second opening and a fan tray may be disposed along a top portion of the electronic chassis. The power distribution member is positioned within the electronic chassis between the first and second side walls. The first power supply mounted to an outer surface of the first side wall. The second power supply is mounted to an outer surface of the second side wall. The power supplys may include an outer shell. The outer shells may include a bottom opening and a top opening. The power supplies may also include first, second and third openings, first and second hook ends, first and second input terminals and a main power supply PC board.

The invention provides the foregoing and other features, and the advantages of the invention will become further apparent from the following detailed description of the presently preferred embodiments, read in conjunction with the accompanying drawings. The detailed description and drawings are merely illustrative of the invention and do not limit the scope of the invention, which is defined by the appended claims and the equivalents thereof.

BRIEF DESCRIPTION OF THE DRAWINGS

FIG. 1a is a back elevated view of a preferred embodiment of a power distribution apparatus, made in accordance with the invention;

FIG. 1b is a side elevated view of the embodiment of FIG. 1a;

FIG. 1c is a top elevated view of the embodiment of FIG. 1a;

FIG. 2a is a side elevated view of a preferred embodiment of a power supply, made in accordance with the invention;

FIG. 2b is a front elevated view of the embodiment of FIG. 2a;

FIG. 3a is an enlarged side view showing the hook end engaged with the power distribution member;

FIG. 3b is a front view of the embodiment of FIG. 3a;

FIG. 3c is a top view of the embodiment of FIG. 3a.

DETAILED DESCRIPTION OF THE PRESENTLY PREFERRED EMBODIMENTS

Referring to FIGS. 1a–b, reference numeral 10 represents a preferred embodiment of a power distribution apparatus, which comprises an electronic chassis 12, a power distribution member 14 and a first power supply 16. The electronic chassis 12 includes a front wall 18, a back wall 20, a first side wall 22 and a second side wall 24. The power distribution member 14 is positioned within the electronic chassis 12 between the first and second side walls 22, 24. The first power supply 16 is mounted to an outer surface of the first side wall 22. Power is distributed from the first power supply 16 to the power distribution member 14.

The electronic chassis 12 further includes a first opening 26. The first opening 26 is disposed along a top portion of the first side wall 22, and allows an airflow to enter the electronic chassis 12. Preferably, this airflow is used to assist in reducing the temperature of the electronic parts within the electronic chassis 12, which includes the power distribution member 14. Also assisting in the reduction of the temperature of the electronic parts within the electronic chassis 12 is a fan tray 28, which is positioned along the top portion of the electronic chassis 12, preferably just above the first opening 26. The fan tray preferably consists of a plurality of fans 30, and is used to force air, which has been heated by the electronic parts within the electronic chassis 12, out of the electronic chassis 12. Preferably, the electronic chassis 12 is mounted, through means of a mounting device 32, to a 19.000 inch standard rack mount 34. The mounting device 32 is shown in FIG. 1b to be of a screw-mounted system, but can preferably be any type of mounting system used within the art. Conversely, due to the width of the rack mount 34, the electronic chassis 12 itself maintains a width of 19.000 inches.

Additionally, the electronic chassis 12 may include a second opening 36. The second opening 36 is also disposed along the top portion of the electronic chassis 12, and is preferably located in the same location on the second side wall 24 as the first opening 26 is located on the first side wall 22. As is the case with the first opening 26, the second opening 36 is preferably used to provide an air flow to the electronic chassis 12 to assist in reducing the temperature of the electronic parts contained within the electronic chassis 12.

As shown in FIGS. 2a–b, the first power supply 16 further includes an outer shell 38. The outer shell 38 includes a bottom opening 40 and a top opening 42. The openings 40, 42 of the outer shell 38 allow for an airflow to enter the first power supply 16 in order to cool the electronic parts disposed within the first power supply 16. Preferably, the top opening 42 of the first power supply 16 coincides in location to the first opening 26 of the electronic chassis 12. This allows the air flow entering the first power supply 16 to enter the electronic chassis 12, reduce the temperature of the electronic parts within the electronic chassis 12, and be forced out of the electronic chassis 12 by means of the fan tray 28. Also included on the first power supply 16 are first, second and third openings 44, 46, 48. These openings 44, 46, 48 are used to assist in the mounting of the first power supply 16 on the electronic chassis 12, and preferably will receive extended portions of the electronic chassis 12. Also, the first power supply includes first and second input terminals 56, 58. The input terminals 56, 58 are preferably adapted to receive a voltage input from the telecommunication systems' central office battery room. Once the input has been received, the first power supply 16 can then convert the voltage to the required voltage necessary to power the equipment contained within the electronic chassis 12.

Finally disposed within the first power supply 16 are first and second hook ends 50, 52. The hook ends are utilized to operably make an electrical connection between the power distribution member 14 and a main power supply PC board 54. The main power supply PC board 54 is also disposed within the first power supply 16. A more detailed view of the interplay between the hook ends 50, 52 and the power distribution member 14 is shown in FIGS. 3a–c. As is shown, the second hook end 52 is operably fitted within an opening in the power distribution member 14, and provides an electrical connection therewith.

As shown in FIGS. 1a–c, the power distribution apparatus 10 may also include a second power supply 60. The second power supply 60 is preferably mounted to an outer surface of the second side wall 36 of the electronic chassis 12. In all respects, the second power supply 60 is similar in structure and design to the first power supply 16, and power is distributed from the second power supply 60 to the power distribution member 14 in the same way as the first power supply 16. As a result, FIGS. 2a–b, which show the detail of the first power supply 16, are a mirror image of the second power supply 60. Thus, the second power supply 60 preferably includes first, second and third openings, first and second hook ends, first and second input terminals and a main power supply PC board.

It should be noted that the preferred embodiment described above, while concerning power distribution within a telecommunication system, can also be applicable and expanded to include other redundant data interface modules as well, including, for example, Sonet interfaces.

While the embodiments of the present invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

I claim:

1. A power distribution apparatus, comprising;
   an electronic chassis including a front wall, a back wall and first and second side walls, the first side wall including a first side wall opening formed therein;
   a power distribution member positioned within the electronic chassis between the first and second side walls and extending from the first side wall to the second side wall; and
   a first power supply device mounted to an outer surface of the first side wall, the first power supply device electrically connected to the power distribution member, the first power supply device including an outer shell, the outer shell including a bottom opening, a top opening and an air passageway extending from the bottom opening to the top opening, the top opening in communication with the first side wall opening to allow air to flow through the air passageway and into the electronic chassis, wherein power is distributed from the first power supply device to the power distribution member.

2. The apparatus of claim 1, further including a second power supply device mounted to an outer surface of the second side wall, wherein power is distributed from the second power supply device to the power distribution member.

3. The apparatus of claim 1, wherein the air flows up through the bottom opening, through the air passageway, through the top opening, through the first side wall opening and into the electronic chassis.

4. The apparatus of claim 3, wherein the electronic chassis has a width of 19.000 inches, and is operably mounted to a 19.000 inch standard rack mount.

5. The apparatus of claim 1, wherein the first opening is disposed along a top portion of the first side wall of the electronic chassis; and a fan tray positioned along the top portion of the electronic chassis to draw the air upward through the air passageway into the electronic chassis and force the air out of the electronic chassis.

6. The apparatus of claim 5, wherein the first power supply device further includes first, second and third openings to allow the first power supply device to be mounted to the electronic chassis.

7. The apparatus of claim 1, wherein the first power supply device further includes first and second hook ends operatively electrically connected to the power distribution member;

first and second input terminals; and a main power supply PC board operatively electrically connected to the first and second hook ends.

8. A method of operation of a power distribution apparatus, comprising the steps of:

providing an electronic chassis, a power distribution member and a first power supply device, the electronic chassis including a front wall, a back wall and first and second side walls, the first side wall including a first side wall opening formed therein, the power distribution member positioned within the electronic chassis between the first and second side walls and extending from the first side wall to the second side wall, the first power supply device mounted to an outer surface of the first side wall, the first power supply device electrically connected to the power distribution member, the first power supply device including an outer shell, the outer shell including a bottom opening, a top opening and an air passageway extending from the bottom opening to the top opening, the top opening in communication with the first side wall opening;

distributing power from the first power supply device to the power distribution member and, flowing air through the air passageway and into the electronic chassis.

9. The method of claim 8, further providing a second power supply device mounted to an outer surface of the second side wall; and further including the step of:

distributing power from the second power supply device to the power distribution member.

10. The method of claim 8, further including the step of:

flowing the air up through the bottom opening, through the air passageway, through the top opening, through the first side wall opening and into the electronic chassis.

11. The method of claim 10, further providing a fan tray positioned along a top portion of the electronic chassis; and further including the steps of:

drawing the air upward through the air passageway into the electronic chassis; and, forcing air out of the electronic chassis.

12. The method of claim 11, further providing first, second and third openings disposed on the first power supply device; and further including the step of:

mounting the first power supply device on the first side of the electronic chassis.

13. The method of claim 12, further providing first and second hook ends disposed on the first power supply device; and further including the step of:

operatively electrically connecting the first and second hook ends to the power distribution member.

14. The method of claim 13, further providing a main power supply PC board disposed within the first power supply device; and further including the step of:

operatively electrically connecting the main power supply PC board to the first and second hook ends.

15. A power distribution apparatus, comprising:

an electronic chassis operatively mounted to a 19.000 inch standard rack mount, the electronic chassis having a width of 19.000 inches and including a front wall, a back wall and first and second side walls, the first side wall including a first side wall opening formed therein, the second side wall including a second side wall opening formed therein;

a power distribution member positioned within the electronic chassis between the first and second side walls and extending from the first side wall to the second side wall;

a first power supply device mounted to an outer surface of the first side wall, the first power supply device electrically connected to the power distribution member, the first power supply device including an outer shell, the outer shell including a bottom opening, a top opening and an air passageway extending from the bottom opening to the top opening, the top opening in communication with the first side wall opening to allow air to flow through the air passageway and into the electronic chassis; and a second power supply device mounted to an outer surface of the second side wall, the second power supply device electrically connected to the power distribution member, the second power supply device including an outer shell, the outer shell of the second power supply device including a bottom opening, a top opening and an air passageway extending from the bottom opening of the outer shell of the second power supply device to the top opening of the outer shell of the second power supply device, the ton opening of the outer shell of the second power supply device in communication with the second side wall opening to allow air to flow through the air passageway of the outer shell of the second power supply device and into the electronic chassis, wherein power is distributed from each of the first and power supply devices to the power distribution member.

16. The apparatus of claim 15, wherein the first opening is disposed along a top portion of the first side wall of the electronic chassis and wherein the second opening is disposed along a top portion of the second side wall of the electronic chassis; and a fan tray positioned along a top portion of the electronic chassis to draw the air upward through the air passageway of the outer shell of the first power supply device and the air passageway of the outer shell of the second power supply device and force the air out of the electronic chassis.

17. The apparatus of claim 16, wherein each of the first and second power supply devices further includes first, second and third openings to allow both the first and second power supply devices to be mounted to the electronic chassis.

18. The apparatus of claim 17, wherein each of the first and second power supply devices further includes first and second hook ends operatively electrically connected to the power distribution member;

first and second input terminals; and a main power supply PC board operatively electrically connected to the first and second hook ends.

* * * * *

UNITED STATES PATENT AND TRADEMARK OFFICE
CERTIFICATE OF CORRECTION

PATENT NO. : 6,188,567 B1
DATED : February 13, 2001
INVENTOR(S) : John B. Borke

It is certified that error appears in the above-identified patent and that said Letters Patent is hereby corrected as shown below:

Column 6,
Line 34, please change the phrase from "the ton opening of the outer shell" to -- the top opening of the outer shell --.

Signed and Sealed this

Thirtieth Day of November, 2004

JON W. DUDAS
*Director of the United States Patent and Trademark Office*